United States Patent
Springer et al.

(10) Patent No.: US 6,716,709 B1
(45) Date of Patent: Apr. 6, 2004

(54) TRANSISTORS FORMED WITH GRID OR ISLAND IMPLANTATION MASKS TO FORM REDUCED DIFFUSION-DEPTH REGIONS WITHOUT ADDITIONAL MASKS AND PROCESS STEPS

(75) Inventors: Lily Springer, Dallas, TX (US); Jeff Smith, Plano, TX (US); Sheldon Haynie, Amherst, NH (US); Joe R. Trogolo, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/335,322

(22) Filed: Dec. 31, 2002

(51) Int. Cl.[7] .................. H01L 21/336; H01L 21/8836
(52) U.S. Cl. ................... 438/301; 438/270; 438/279
(58) Field of Search ............................ 438/301, 270, 438/207, 302, 279, 258, 294

(56) References Cited

U.S. PATENT DOCUMENTS

| 5,181,095 | A | | 1/1993 | Mosher et al. | |
|---|---|---|---|---|---|
| 5,455,447 | A | | 10/1995 | Hutter et al. | |
| 5,969,395 | A | * | 10/1999 | Lee | 257/408 |
| 6,034,413 | A | | 3/2000 | Hastings et al. | |
| 6,093,591 | A | * | 7/2000 | Sawada | 438/207 |
| 6,329,679 | B1 | * | 12/2001 | Park | 257/292 |
| 6,511,885 | B2 | * | 1/2003 | Harada et al. | 438/270 |
| 6,555,895 | B1 | * | 4/2003 | Hshieh et al. | 257/622 |
| 6,576,952 | B2 | * | 6/2003 | Hshieh et al. | 257/328 |
| 6,586,765 | B2 | * | 7/2003 | Lin et al. | 257/48 |

* cited by examiner

*Primary Examiner*—John Niebling
*Assistant Examiner*—Walter Lindsay, Jr.
(74) *Attorney, Agent, or Firm*—Yingsheng Tung; Wade James Brady, III; Frederick J. Telecky, Jr.

(57) ABSTRACT

A method of forming two regions having differing depths using a single implantation process is provided. A mask having two openings associated therewith is formed over a semiconductor body, wherein one of the openings has a size larger than an implantation design rule, and the other opening has a size smaller than the design rule. An implant is performed into the semiconductor body through the implant mask, resulting in two distinct doped regions, wherein the region associated with the larger opening has more dopant than the region associated with the smaller opening. Subsequent activation and thermal processing results in the one region diffusing a greater amount than the second region, thereby resulting in two regions formed concurrently having different depths.

23 Claims, 14 Drawing Sheets

US 6,716,709 B1

TRANSISTORS FORMED WITH GRID OR ISLAND IMPLANTATION MASKS TO FORM REDUCED DIFFUSION-DEPTH REGIONS WITHOUT ADDITIONAL MASKS AND PROCESS STEPS

FIELD OF INVENTION

The present invention relates generally to semiconductor devices and more particularly relates to methods of forming diffusion regions of varying depths in a single implantation.

BACKGROUND OF THE INVENTION

Integrated circuits having bipolar and MOS transistors formed on the same semiconductor substrate have many uses in the electronics industry and are therefore in great demand. On significant advantage of such devices is that they combine the high power and fast switching speeds of bipolar devices with the high density and low power consumption of MOS transistors. The diversity of uses for such BiCMOS devices has fueled a surge toward fabricating faster, denser and more powerful integrated BiCMOS devices by more individual device enhancing manufacturing processes.

When forming devices using a BiCMOS manufacturing process, care is taken to minimize the number of masks employed therein to lower the manufacturing costs. Therefore efforts are made as often as is practicable to integrate the use of regions typically utilized for CMOS devices as regions in a bipolar device, and vice-versa. While such integration does serve to minimize manufacturing costs, in some cases the integration causes performance tradeoffs to be made.

For example, prior art FIG. 1 illustrates an NPN type bipolar transistor 10 fabricated using a BiCMOS type fabrication process. The transistor 10 has an n-buried layer (NBL) 12 that is formed in a lightly doped P-type substrate 14. A p-type epi layer 16 is then grown over the NBL 12 and the substrate 14. A deep N+ ring 18 is then formed by performing either an n-type implant or n-type thermal deposition in the epi 16. The deep N+ ring 18 couples down to the NBL 12 to form a collector region 20. The deep N+ ring 18 also defines therein an isolated base region 22 comprising the p-epi. The N+ region 18 may be a ring or may simply be a single region extending down to the NBL region 12 for purposes of making contact thereto. A p-type source/drain implant is then performed to define a base contact region 24 and an n-type source/drain implant is performed to form an emitter region 26, wherein the base contact region is formed concurrently with the formation of PMOS source/drain regions elsewhere, and the emitter region is formed concurrently with NMOS source/drain regions elsewhere, respectively.

The NPN bipolar transistor 10 of prior art FIG. 1 may be employed in various types of applications, and in some applications the transistor breakdown voltage may be an issue. For example, a collector-to-emitter breakdown voltage ($BV_{CEO}$) of the transistor 10 relies on the base (or epi) thickness. That is, a distance 28 between a bottom of the emitter 26 and a top of the NBL 12 will have a significant impact on $BV_{CEO}$. Although the epi region 16 is initially thick, the thickness of the epi is reduced at locations where the NBL is present due to an up-diffusion 30 of the NBL. The thin epi 16 in that region limits transistor $BV_{CEO}$ by letting the space charge region at the NBL and epi junction reach the emitter during device operation, disadvantageously resulting in a punch-through breakdown condition.

If the epi layer thickness could be increased, or the NBL thickness could be reduced, the transistor $BV_{CEO}$ can be increased. The epi and NBL thicknesses, however, are fixed uniformly across the die for the standard BiCMOS process, and thus any local adjustments thereof would require additional masks and/or processing steps. Such additional actions are disadvantageous when attempting to minimize costs in the fabrication process.

Another NPN type bipolar transistor device fabricated in a standard BiCMOS manufacturing process is illustrated in prior art FIG. 2, and designated at reference numeral 50. The transistor 50 has the NBL 12 fabricated in the substrate (p-sub) 14 and the epi layer 16 is formed thereover in a manner similar to that described above. Deep N+ regions 18 are formed down to the NBL 12 and a deep n-well region 52 is formed in the p-epi 16 down to the NBL as illustrated. Concurrently, deep n-well regions are formed elsewhere on the die and are utilized for various purposes, for example, as high voltage PMOS transistors' tank region.

Once the deep n-well region 52 is formed, a shallow P-well region 54 is formed in the deep n-well to form the base region 56. Therefore the NBL 12, deep N+ region 18 and the deep n-well 52 together form the collector 58 of the bipolar transistor 50. N-type and p-type source/drain implants are then performed to form the emitter region 60 and the base contact region 62, respectively.

The bipolar transistor 50 has a poor gain, which is sometimes referred to as the transistors β or $H_{FE}$. When using the BiCMOS process described above, the n-type source/drain region 60 which forms the emitter is quite shallow (for CMOS optimization), and the shallow p-well 54 has a high doping concentration, is rather deep, and has a slight retrograde profile for CMOS purposes, and these factors contribute to poor bipolar transistor gain. That is, a depth 64 of the heavily doped shallow p-well 54 and the shallowness of the emitter (NSD) 60 results in a depth difference (or base width) 66 that is relatively large, thereby resulting in a low gain. This is disadvantageous in transistor applications where a high gain is important or desired.

Therefore there is a need in the art for manufacturing processes and techniques that allow for an optimization of transistor parameters without additional substantial more processing steps or employing additional masking steps.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to a method of forming two regions concurrently via implantation in a semiconductor body such as a substrate, wherein the two regions have differing depths. The differing depths are provided by forming a mask having one opening associated with a first region that is larger than an implantation design rule while forming a second opening in the mask associated with a second region that is smaller than the design rule. Accordingly, the second region receives less dopant than the first region during a concurrent implant through both openings, and subsequent diffusion results in the second region being more shallow than the first region. Further, the present invention contemplates first and second regions occupying approximately the same device area, but having differing depths by masking the second opening of the second region into a plurality of openings that are smaller than the design rule. After implantation and diffusion, the first and second regions are approximately the same size, but have different depths.

According to one aspect of the present invention, a method of forming a bipolar transistor is disclosed. The method comprises forming a patterned buried layer by masking over a semiconductor substrate, wherein the mask has a macroscopic opening made of a plurality of microscopic openings therein. These microscopic openings are smaller than an implantation design rule. A buried layer implant is then performed through the mask, resulting in a plurality of distinct implanted regions associated with the openings.

After thermal processing, the implanted regions diffuse together to form a buried layer region that serves as a portion of the collector region for the transistor. A semiconductor layer, for example p-epi, is formed over the substrate and forms a transistor base region, while an emitter region is formed therein. The buried layer collector region has less dopant associated therewith than would otherwise exist with a single macroscopic opening associated with the buried layer mask, and thus less up-diffusion occurs into the semiconductor base region. With less up-diffusion of the buried layer collector, a distance between the collector and emitter is increased over a conventional device, resulting in an increased collector-to-emitter transistor breakdown voltage, with requiring additional masks or processing steps.

According to another aspect of the present invention, a method of forming a bipolar transistor comprises forming a buried layer collector in a substrate and forming a semiconductor layer thereover. A deep well region is formed in the semiconductor layer down to the buried layer collector to form collectively a bipolar transistor collector region. A shallow well mask is then formed over the semiconductor layer having a macroscopic opening comprising a plurality of microscopic openings, wherein the microscopic openings are smaller than an implantation design rule.

A base region is formed through the shallow well mask, resulting in a plurality of implanted regions in the deep well region. Thermal processing causes the implanted regions to diffuse together and the small openings cause less dopant to reside in the deep well region, leading to less vertical diffusion associated therewith, and at least a portion of the base being more shallow than would otherwise occur with a single macroscopic opening in the shallow well mask. An emitter region is then formed in the base region, for example, with a source/drain implant. Because the base region is shallower than would otherwise be, a base width associated with a distance between a bottom of the emitter and a bottom of the base is decreased, resulting in an increase in transistor gain without additional masks or processing steps.

According to another aspect of the present invention, a method of forming a bipolar transistor comprises forming a buried layer collector in a substrate and forming a semiconductor layer thereover. A deep well region is formed in the semiconductor layer down to the buried layer collector to form collectively a bipolar transistor collector region. A shallow well of opposite type region is formed in the deep well region and forms a base region in the collector region. Another shallow well mask of the opposite type to the base serving as an emitter mask is then formed over the semiconductor layer having at least one opening over the base region, wherein the at least one opening is smaller than an implantation design rule. The shallow well mask may have a larger opening associated therewith elsewhere that is larger than an implantation design rule, and such larger opening is associated with another shallow well region.

An emitter implant is performed through the emitter mask using a shallow well implant, wherein the dopant within the small opening is less than a dopant associated with the larger opening and forms an emitter region. After thermal processing the vertical diffusion associated with the emitter region is less than would otherwise occur if the opening were larger than the implantation design rule. Thus the shallow well implant in the small opening is not as deep as the shallow well base region in which it is formed, yet is deeper than an emitter region otherwise formed using a source/drain implant. In the above manner, a base width of the bipolar transistor is decreased, thereby advantageously improving transistor gain without requiring additional processing or mask steps.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
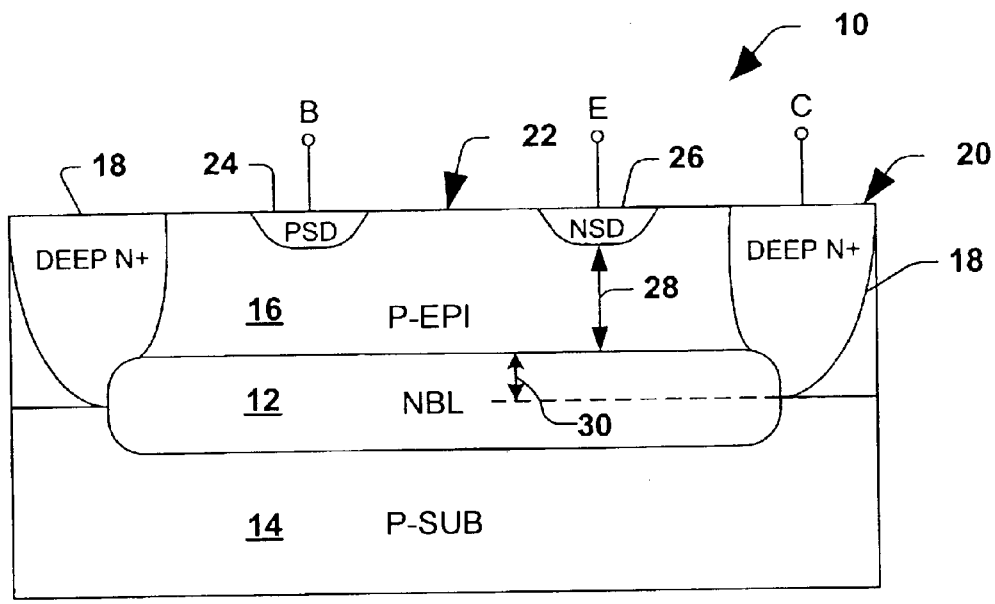
FIG. 1 is a prior art fragmentary cross section diagram illustrating a bipolar transistor device formed in a BiCMOS type integrated circuit manufacturing process.
Figure 2:
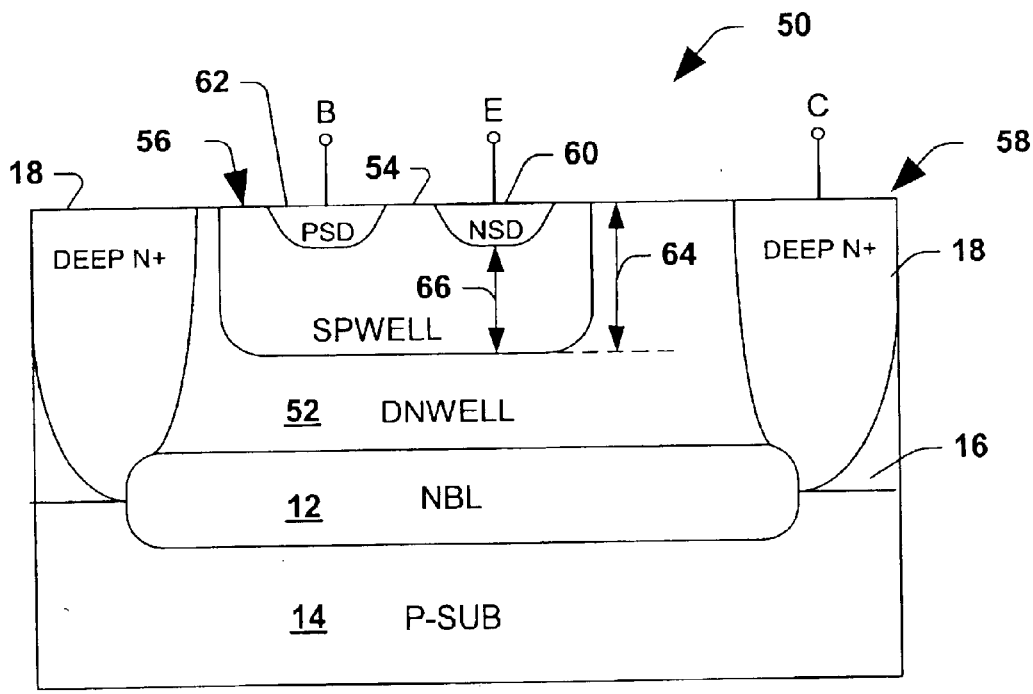
FIG. 2 is a prior art fragmentary cross section diagram illustrating another bipolar transistor device formed in a BiCMOS type integrated circuit manufacturing process.

The present invention will now be described with reference to the attached drawings, wherein like reference numerals are used to refer to like elements throughout. The invention relates to a method of forming two regions in a semiconductor body concurrently via implantation, wherein the two regions have differing depths associated therewith. The present invention takes advantage of a phenomena that a region associated with a mask opening that is less than a threshold size will not receive the same amount of dopant than a region associated with a mask opening which is larger than the threshold size, which is referred to herein as a size associated with an implantation design rule. Consequently, upon activation and diffusion of the dopant to form the two regions, the region associated with the smaller mask opening is shallower than the other region due to less dopant and thus less diffusion. By employing the above principle, transistor devices are customized by forming regions of differing depths without requiring additional implantation processing steps and/or additional mask steps.

Figure 3:
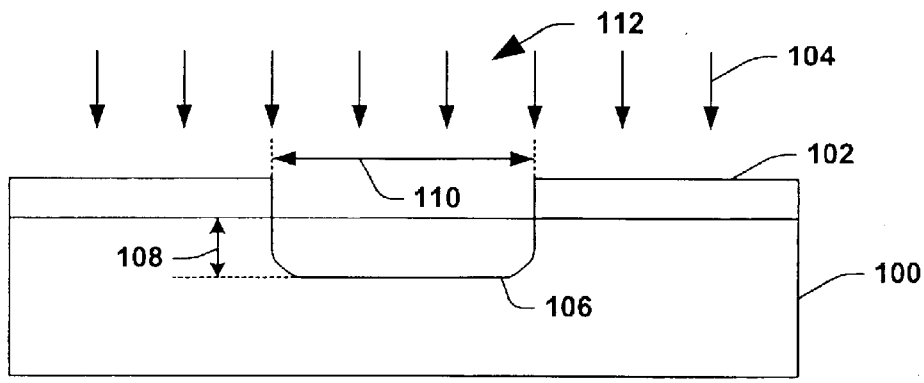
FIG. 3 is a fragmentary cross section diagram illustrating a mask overlying a semiconductor material, the mask opening having a width that impacts a resultant region depth upon implantation therethrough.

The inventors of the present invention have appreciated that a phenomena associated with implantation through a mask may be employed to customize transistor device regions formed via implantation without the use of additional processing steps or additional masks. The phenomena will now be briefly described in order to fully appreciate the various aspects of the present invention. Turning to FIG. 3, a semiconductor body 100 has an implantation mask 102 formed thereover. In one example, the implantation mask 102 comprises a patterned photoresist, however, hard mask layers of other materials may be employed and are contemplated as falling within the scope of the present invention.

In FIG. 3, the semiconductor body 100 is implanted through the mask 102 with an implant 104 having a dopant concentration (in atoms/cm$^2$) and an implant energy associated therewith. Based on the above parameters and an implantation time, the implant 104 results in a region 106 in the body 100. The implant parameters associated with the implant 104 will influence a depth 108 of the region 106 along with the dopant concentration (in atoms/cm$^3$). The depth 108 of the region 106, however, is also influenced by a width or size 110 of the mask opening 112.

Figure 4:
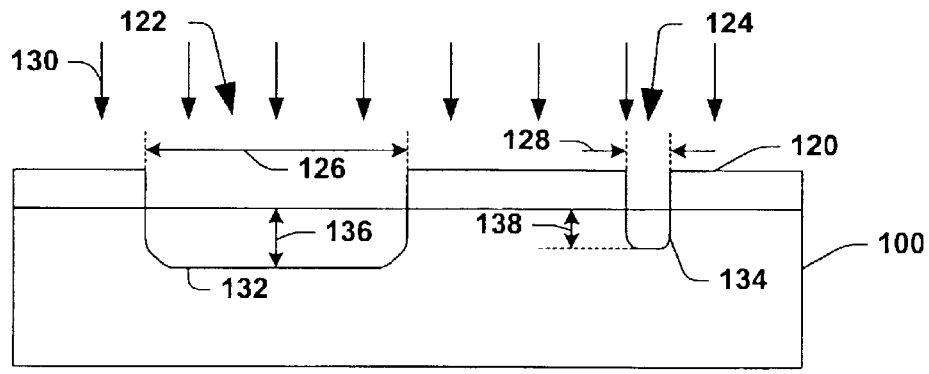
FIG. 4 is another fragmentary cross section diagram illustrating a mask having two openings associated therewith, wherein the opening size impacts resultant region depths upon implantation therethrough according to the present invention.

For example, as illustrated in FIG. 4, the semiconductor body has a mask 120 formed thereover, wherein the mask has two openings 122 and 124 associated therewith. The two openings 122, 124 are different sizes, wherein the first opening 122 has a first size 126, and the second opening 124 has a second size 128, and wherein the first size is larger than the second size. The semiconductor body 100 is subjected to an implantation 130 through the mask 120, wherein both openings 122 and 124 are subjected to substantially the same implant dose and implant energy, respectively. Since both openings are of different sizes, one expects that the dimensions of the regions formed therein 132 and 134 to vary. Surprisingly, however, the depths of the regions also differ; that is a depth 136 associated with the first region 132 is larger than a depth 138 of the second region 134, even though both regions were subjected to the same implantation process 130.

Figure 5:
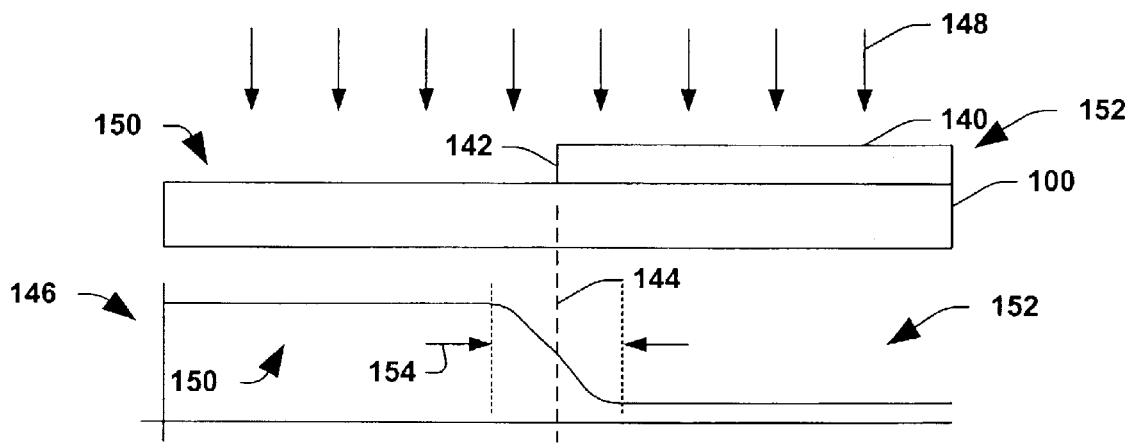
FIG. 5 is a graph illustrating a dopant concentration profile in a semiconductor material as a function of a mask edge located thereover.
Figure 6:
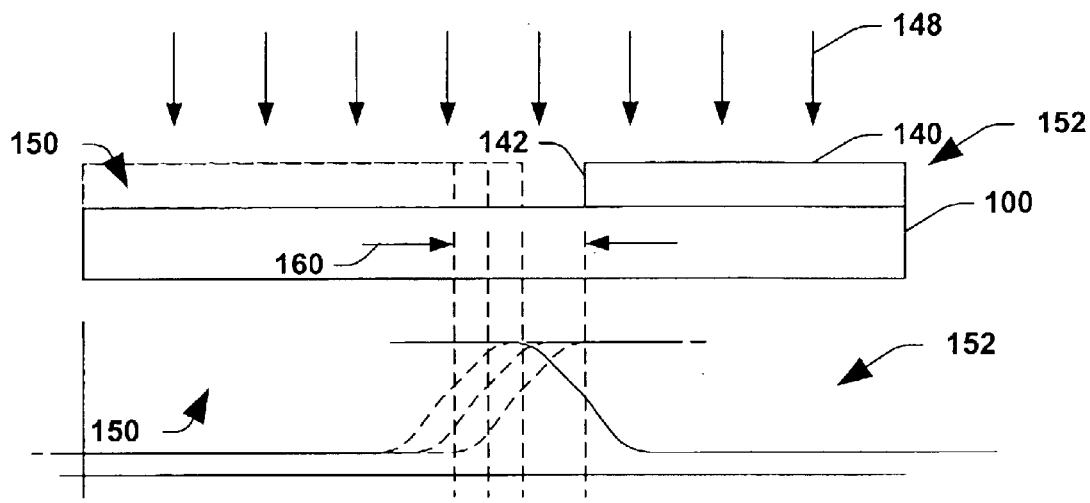
FIG. 6 is a graph illustrating a dopant concentration profile in a semiconductor material as a function of a mask opening size located thereover.

The above phenomena can be understood, at least in one respect, with respect to FIGS. 5 and 6. FIG. 5 is a composite diagram that illustrates a semiconductor body 100 having a mask 140 formed thereover, wherein the mask has an edge 142 associated therewith associated with a location 144. FIG. 5 also illustrates a dopant concentration profile 146 that illustrates relative concentration values of dopant in the semiconductor body due to an implantation process 148 through the mask 140. Note that in an area 150 where the mask is not present, a maximum dopant concentration resides in the body 100, however, in an area 152 above where the mask resides, a minimum dopant concentration exists. In the area 144 above where the mask edge 142 resides, however, the dopant concentration 146 transitions from a maximum amount to the minimum amount but not in a step function fashion. Rather the dopant concentration transitions over a distance 154. If the mask 140 has another mask edge that is substantially close to the first edge 142, for example, near the area 154, the total amount of dopant in the body would be less than the expected amount due to the size of the mask opening.

Turning to FIG. 6, when the mask 140 has multiple edges comprising a mask opening (highlighted as multiple edges in phantom to illustrate various mask opening sizes), a size 160 of the mask opening reaches a threshold value under which an expected dopant concentration within the body is not obtained. That is, if an implant recipe has a dose of X atoms/cm$^2$ at an implantation energy of Y to obtain a target profile peak concentration at a specific depth of Z atoms/cm$^3$, a mask opening that is less than the threshold value will result in a peak concentration at the given depth that is less than Z atoms/cm$^3$. With less dopant, subsequent diffusion is less and the resultant region will be more shallow than would otherwise have formed with Z atoms/cm$^3$. In accordance with the present invention, the threshold mask size opening is called the implantation design rule or "minimum design rule" for a given implant. Note that the implantation design rule is not a fixed distance, but may vary depending upon the implantation tool or technique employed, etc. Therefore the implantation design rule for a deep well mask implant design rule may be a size "i", while a shallow well mask implant design rule may be a size "j", wherein i ≠ j. Therefore the implantation design rule or the minimum design rule is a size threshold beyond which the diffused junction depth does not change substantially.

Thus the inventors of the present invention appreciated that by varying mask opening sizes and intentionally reducing one or more mask openings below what one would typically employ for a given implant process, one can customize regions in a semiconductor manufacturing process without the need for additional processing steps or masks.

Figure 7:
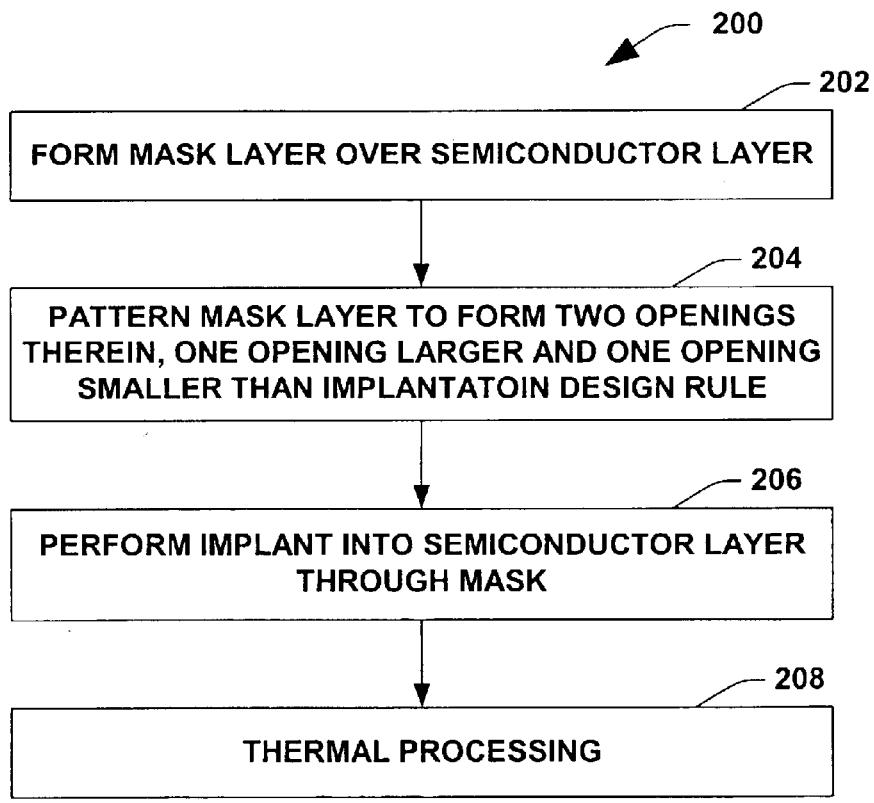
FIG. 7 is a flow chart illustrating a method of forming two regions having different depths via implantation using a single implant process according to the present invention.

Turning now to FIG. 7, a method 200 of forming two regions with a single implant in a semiconductor material, wherein the two regions exhibit different depths is disclosed. Although the method 200 and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. In addition, the methods according to the present invention may be implemented in association with the formation and/or processing of structures illustrated and described herein as well as in association with other structures not illustrated.

In FIG. 7, the method 200 comprises forming a mask layer over a semiconductor body or substrate at 202. Although the term substrate is used in many instances, it should be understood that the term substrate includes a semiconductor substrate, a semiconductor epitaxial layer deposited or otherwise formed on a substrate or other type semiconductor body, and all such structures are contemplated as falling within the scope of the present invention. The mask layer in one example, is a photoresist material formed via a spin-on or other type deposition process, however, the mask layer may comprise other masking layers such as a dielectric layer or other material that may serve as an implantation mask.

The implantation mask layer is patterned at 204 to form at least two openings therein, wherein the two openings are of different sizes. More particularly, a first opening has a first size which is greater than an implantation design rule associated with the implant to be performed, while the second opening has a second size (smaller than the first size), and the second opening size is less than the implantation design rule. An implant is then performed into the substrate through the mask layer at 206, resulting in the concurrent formation of two distinct doped regions in the substrate corresponding to the two mask openings, respectively. Due to the mask openings having differing sizes, wherein one is larger than, and the other is smaller than the implantation design rule, the first dopant region associated with the first mask opening receives more dopant than the second dopant region associated with the second mask opening.

The method 200 continues at 208, wherein thermal processing occurs, and wherein the dopant in the first and second dopant regions (e.g., in the substrate) is activated and undergoes diffusion in a conventional fashion. Since the dopant concentration is greater in the first dopant region than in the second dopant region, more vertical diffusion occurs with the first dopant region, resulting in a first region having a depth that is greater than the second region. Note that in the above fashion, the method 200 provides a manner of forming regions of differing depths using a single mask step and implantation step, thereby requiring no additional processing. As will be appreciated more fully below, the method 200 may be employed to customize various device regions without using additional processing or mask steps.

Further, although the exemplary method 200 describes the second mask opening as smaller than the first opening, alternatively, the second opening may be the same size macroscopically than the first opening, but have a plurality of mask layer regions therein that define a plurality of sub-openings within the second opening that each are smaller than the design rule. Accordingly, implantation and thermal processing will result in the sub-dopant regions associated with the sub-openings to diffuse together to form a single doped region in the substrate having a lateral dimension approximately the same as the first region, but having a depth which is less than the first region, as may be desired.

Figure 8:
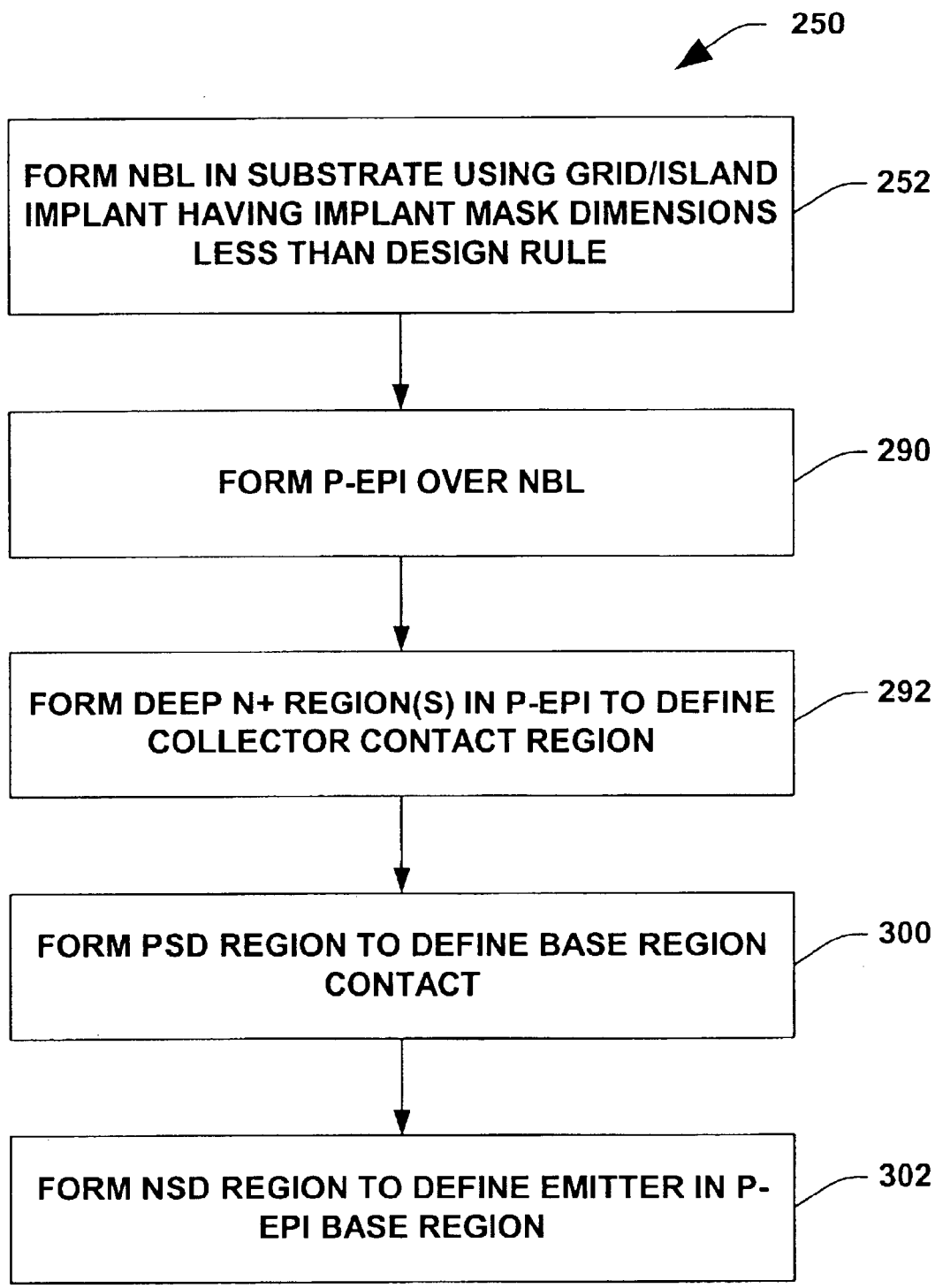
FIG. 8 is a flow chart diagram illustrating a method of forming a bipolar transistor device using a grid/island type NBL mask according to the present invention.
Figure 9:
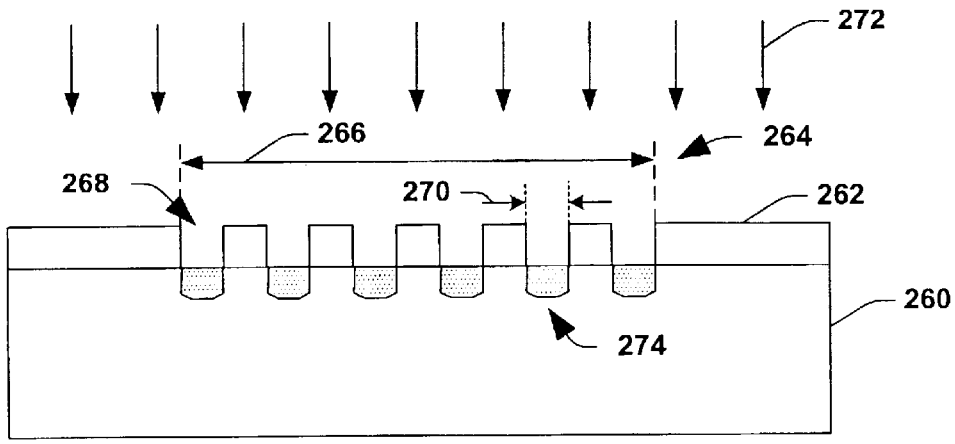
FIG. 9 is a fragmentary cross section diagram illustrating a grid/island type NBL mask having a plurality of openings smaller than an NBL implantation design rule according to the present invention.

Turning now to FIG. 8, a method 250 of forming a bipolar transistor device in a BiCMOS type manufacturing process is disclosed using the principles associated with the method 200 of FIG. 7 and illustrated in FIGS. 4–6. The method 250 of FIG. 8 will be described in conjunction with exemplary FIGS. 9–15 to appreciate various aspects of the invention, however, such figures are not intended to limit the scope of the present method. The method begins at 252, wherein an n-buried layer (NBL) is formed in a semiconductor substrate using a grid or island type NBL mask. For example, as illustrated in FIG. 9, a semiconductor body 260 has an NBL mask 262 formed thereover. The mask 262 has a macroscopic opening 264 associated therewith having a size 266 that generally corresponds to the desired size of the NBL region to be formed. The macroscopic opening 264 has a plurality of microscopic openings 268 associated therewith, and in the present example each of the openings have a size 270 which is less than an implantation design rule for an NBL implant.

Still at 252, an NBL implant 272 is performed into the substrate 260 through the NBL mask 262, forming a plurality of distinct doped regions 274 corresponding to the openings 268. The dose and depth of each of the regions 274 generally corresponds to the implantation dose, energy and duration of the implant 272, however, as discussed earlier an amount of dopant in each of the regions is less than would otherwise occur therein if the size 270 of the openings were greater than the implantation design rule.

Figure 11:
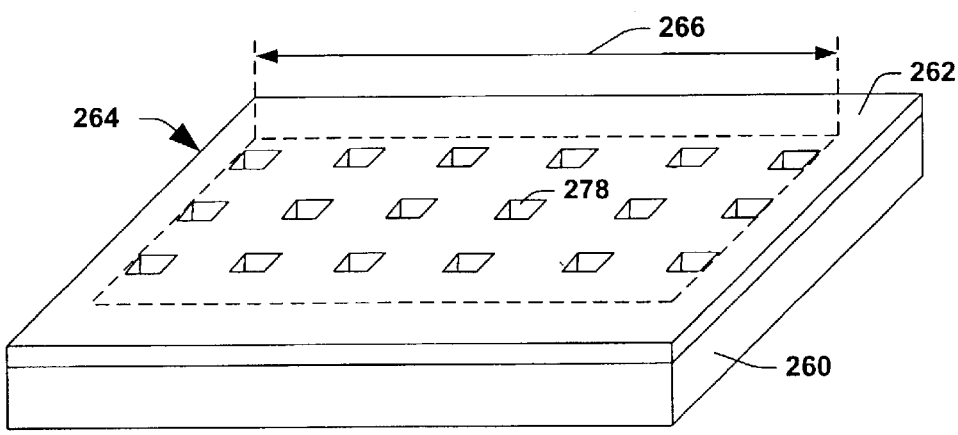
FIG. 11 is a perspective view of an implant mask having a plurality of via openings arranged in a grid associated with a macroscopic mask opening, wherein the via openings are smaller than an implantation design rule according to the present invention.

The NBL mask 262 has the macroscopic opening 264 having a plurality of openings 268 associated therewith. Such openings 268 may be formed, for example, as either a patterned grid, wherein the mask material is patterned to form a plurality of mesas, or as a series of patterned vias down to the semiconductor material 260. For example, referring to FIG. 10 (which is not necessarily drawn to scale, but rather is merely provided for the sake of clarity), the macroscopic opening 266 portion of the mask layer 262 is patterned to form a plurality of mesa structures 276, wherein spacing between the structures is smaller than the implantation design rule. Alternatively, as illustrated in FIG. 11, the macroscopic opening portion 264 of the mask layer 262 is patterned to form a plurality of vias 278 down to the substrate 260, wherein a size of the vias is smaller than the NBL implant design rule.

Figure 12:
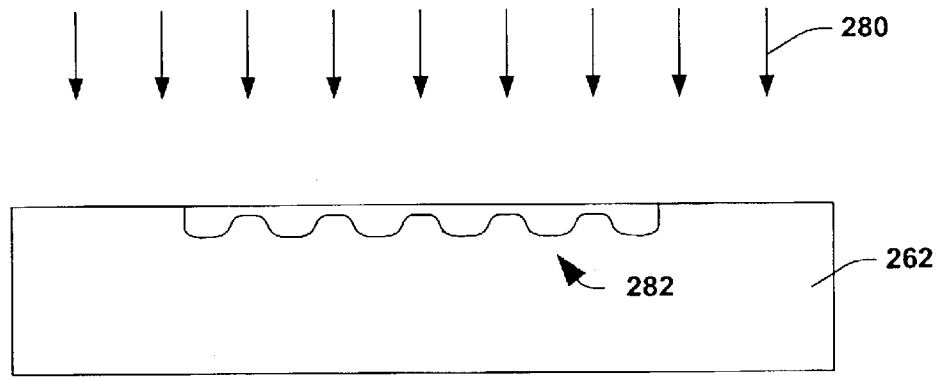
FIG. 12 is a fragmentary cross section diagram illustrating an NBL region formed with the mask of FIG. 9.
Figure 13:
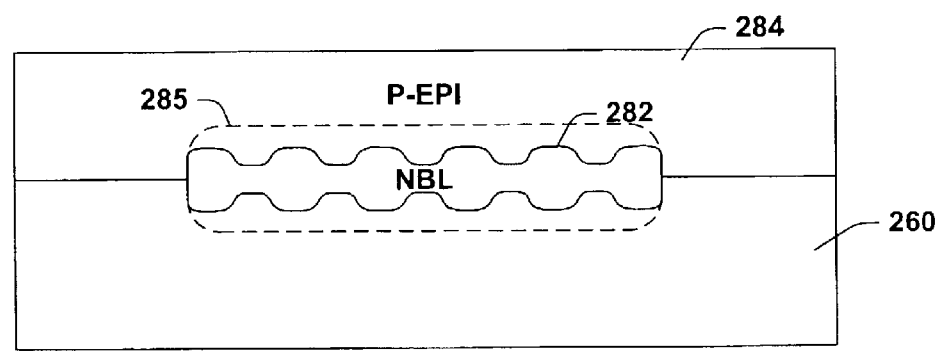
FIG. 13 is a fragmentary cross section diagram illustrating a semiconductor base layer formed over the NBL region and an up-diffusion of the NBL into the semiconductor layer according to the present invention.
Figure 10:
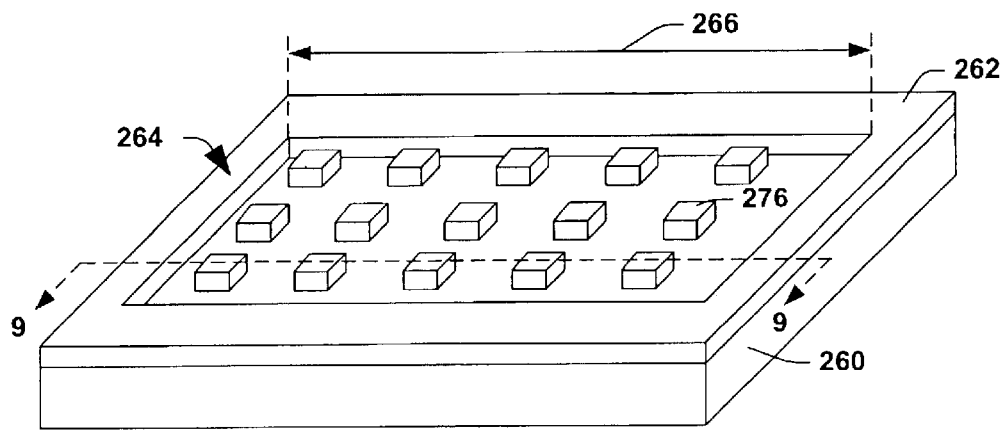
FIG. 10 is a perspective view of an implant mask having a plurality of mask region islands associated with a macroscopic mask opening, wherein spaces between the mask islands or mesas are smaller than an implantation design rule according to the present invention.

Still referring to 252 of FIG. 8, the NBL is further formed by thermal processing, as illustrated in FIG. 12 at reference numeral 280, wherein the doped regions 274 diffuse together to form a single integral region 282 as shown. The grid/island type NBL mask 262 is then removed from the substrate 260, and a silicon layer 284 is formed thereover at 290 of FIG. 8, for example, a p-type layer formed via epitaxial growth, as illustrated in FIG. 13. Due to the thermal conditions present during formation of the layer 284 (as well as other subsequent processing), the NBL region 282 up-diffuses into the overlying semiconductor layer 284.

Note that since the amount of dopant within the NBL region 282 is less than would otherwise exist if the island/grid type NBL mask were not employed, the amount of up-diffusion of the NBL is reduced compared to a conventional NBL. Further, note that such actions reduce an effective thickness of the NBL region 282 without use of additional masks or processing steps. That is, other NBL regions may be formed on the die/wafer wherein the mask opening associated therewith is greater than the implantation design rule, causing the NBL regions associated therewith to extend further up into the overlying semiconductor layer 284. Such an exemplary region 285 is illustrated in phantom in FIGS. 13–15.

Figure 14:
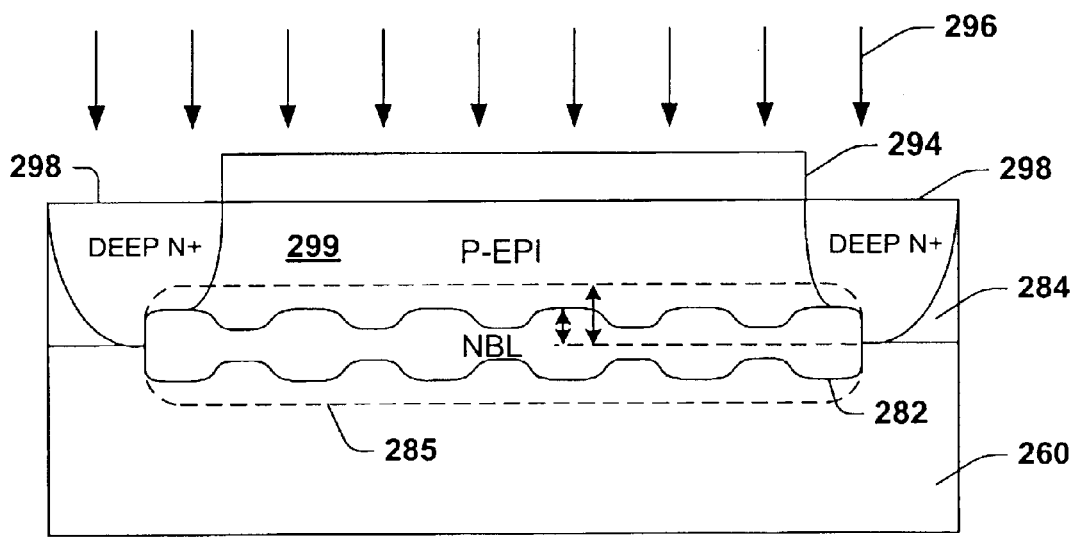
FIG. 14 is a fragmentary cross section diagram illustrating a formation of deep implant regions into the semiconductor layer of FIG. 9 down to the NBL to form a collector region according to the present invention.

Returning to FIG. 8, deep N+ regions are formed in the semiconductor layer at 292 to define a collector contact region. For example, as illustrated in FIG. 14, a deep N+ mask 294 is formed over the semiconductor layer 284, and a deep N+ implant 296 is performed, wherein exposed portions of the semiconductor layer 284 receive n-type dopant, and wherein upon implant and activation, the portions form deep N+ regions 298 that extend down to the NBL region 282. The deep N+regions 298 together with the NBL region 282 define a collector region of the bipolar transistor and bound a portion of the p-type semiconductor region 284 that defines a base region 299.

Figure 15:
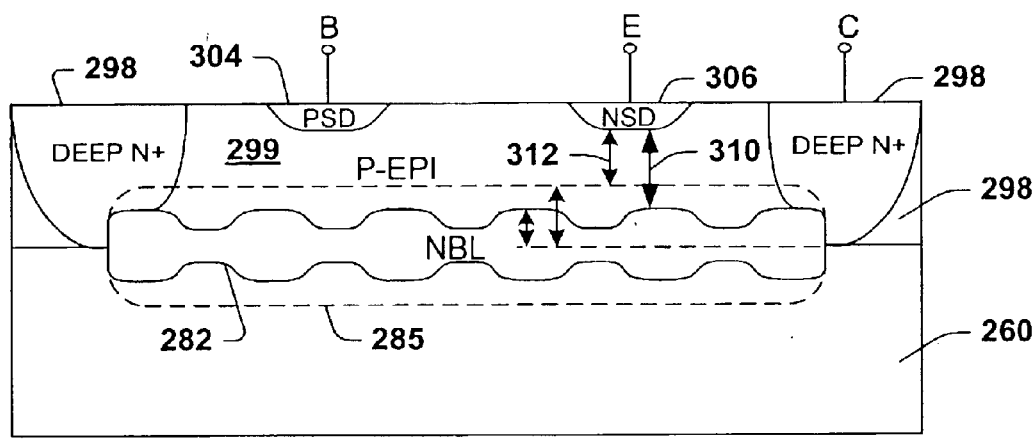
FIG. 15 is a fragmentary cross section diagram illustrating a formation of a base region contact and an emitter region in the semiconductor base layer using CMOS source/drain implants, and illustrating an increase in base width resulting in an increased collector-to-emitter breakdown voltage without additional processing steps or masks according to the present invention.

Returning again to FIG. 8, the method 250 continues at 300 and 302, wherein implants (such as those employed in the BiCMOS process to form p-type and n-type source/drain regions) are performed to form a base region contact and an emitter contact, respectively. For example, as illustrated in FIG. 15, a PMOS source/drain mask (not shown) may be utilized to define an opening through which a p-type source/drain implant is performed to form a PSD (p-type source/drain) region that serves as a base contact 304 for the base 299 of the bipolar transistor. Similarly, an NMOS source/drain mask (not shown) may be employed to define one or more openings through which an n-type source/drain implant is performed to form an NSD (n-type source/drain) region(s) that serves as an emitter region 306 and a collector contact (not shown), if desired.

Note that the method 250 of FIG. 8 advantageously provides for the formation of a bipolar transistor device such as that illustrated in FIG. 15, wherein the NBL region 282 exhibits a substantial reduction in up-diffusion into the base region 299. Therefore a distance 310 between the bottom of the emitter 306 and a top of the NBL 282 is greater than in a conventional device that has an NBL region resembling the phantom NBL region 285 (which defines a distance 312 that is smaller than the distance 310).

With the increased distance between the emitter 306 and the NBL 282, the transistor device of FIG. 15 exhibits a higher collector-to-emitter breakdown voltage than a conventional device, and such performance advantage is obtained without requiring additional processing or mask steps. In addition, since the NBL mask may be patterned in some locations with openings that exceed the implantation design rule and with other openings that are smaller than the design rule, two types of NPN bipolar transistor may be formed concurrently, as may be desired for differing performance requirements.

Although the method 250 of FIG. 8 was described and illustrated in conjunction with the formation of an NPN type bipolar transistor, it should be understood that the present invention also is applicable to the fabrication of PNP type devices, and such alternatives are contemplated as falling within the scope of the present invention.

Figure 16:
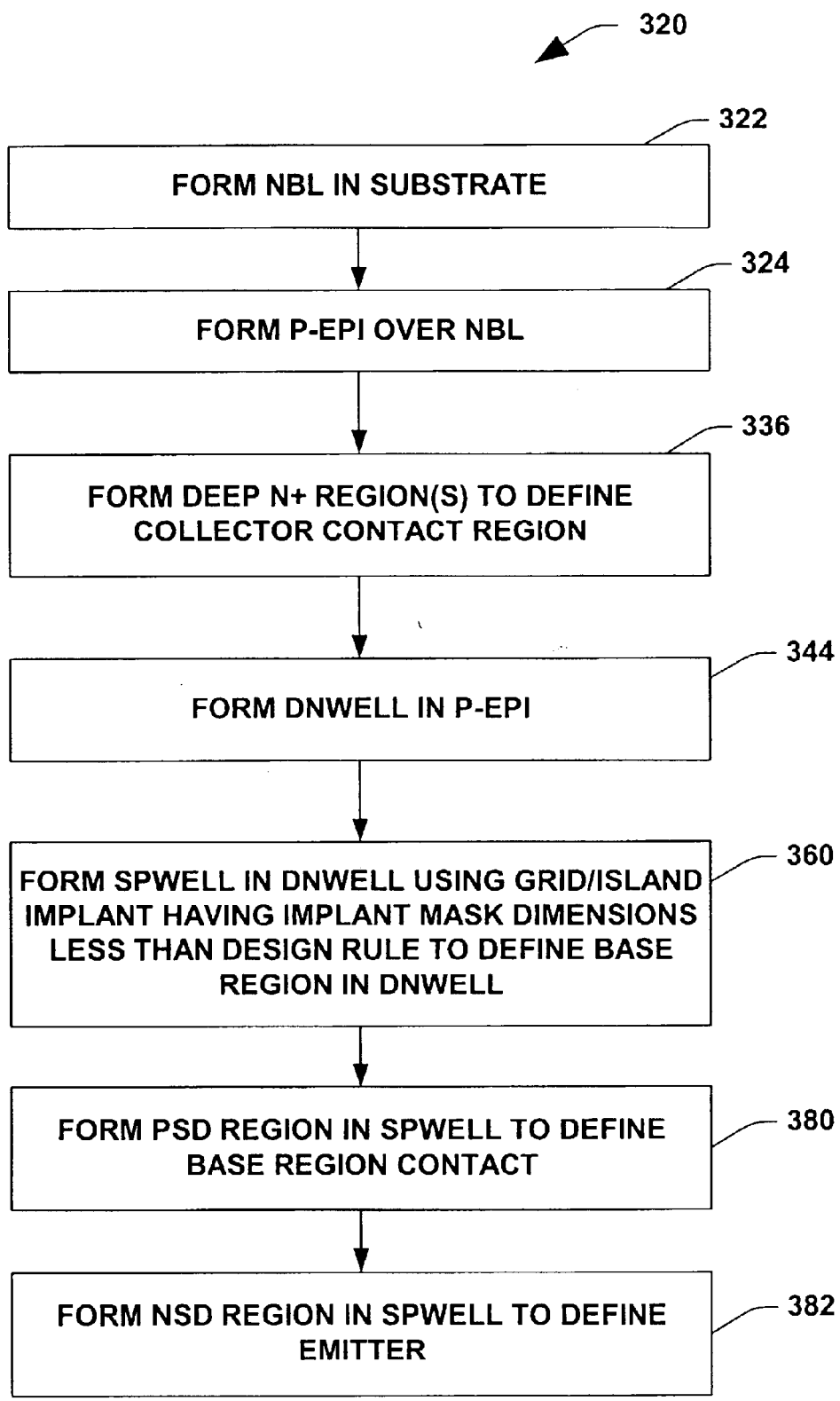
FIG. 16 is a flow chart diagram illustrating a method of forming a bipolar transistor using a grid/island type shallow well mask to define the base region according to the present invention.
Figure 17:
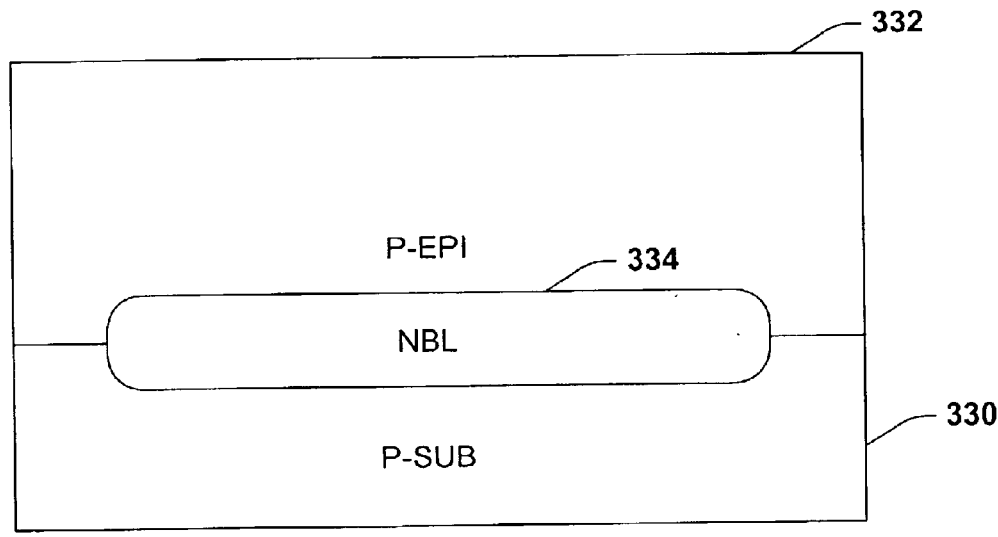
FIG. 17 is a fragmentary cross section diagram illustrating an NBL region formed in a substrate having a semiconductor layer formed thereover.

According to another aspect of the present invention, the principles highlighted supra in conjunction with FIGS. 4–6 may be employed to fabricate another bipolar transistor in a BiCMOS type process flow in FIG. 16, as indicated at reference numeral 320. Although the method 320 of FIG. 16 will be described in conjunction with FIGS. 17–22 for purposes of understanding and clarity, it should be understood that the method is not limited to the above examples. The method 320 begins at 322 with the formation of an NBL region in a p-type substrate, followed by the formation of a p-type semiconductor layer thereover at 324. For example, as illustrated in FIG. 17, the substrate 330 has a semiconductor layer 332 (e.g., a p-epi layer) formed thereover, with an NBL region 334 sandwiched therebetween.

Figure 18:
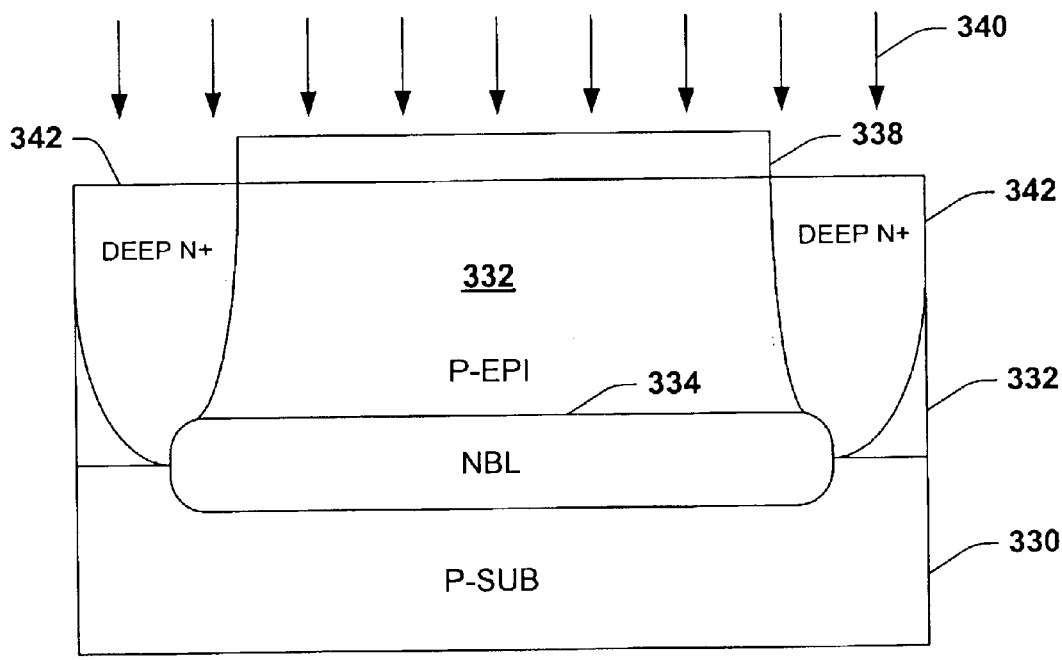
FIG. 18 is a fragmentary cross section diagram illustrating formation of deep implant regions in the semiconductor layer down to the NBL.
Figure 19:
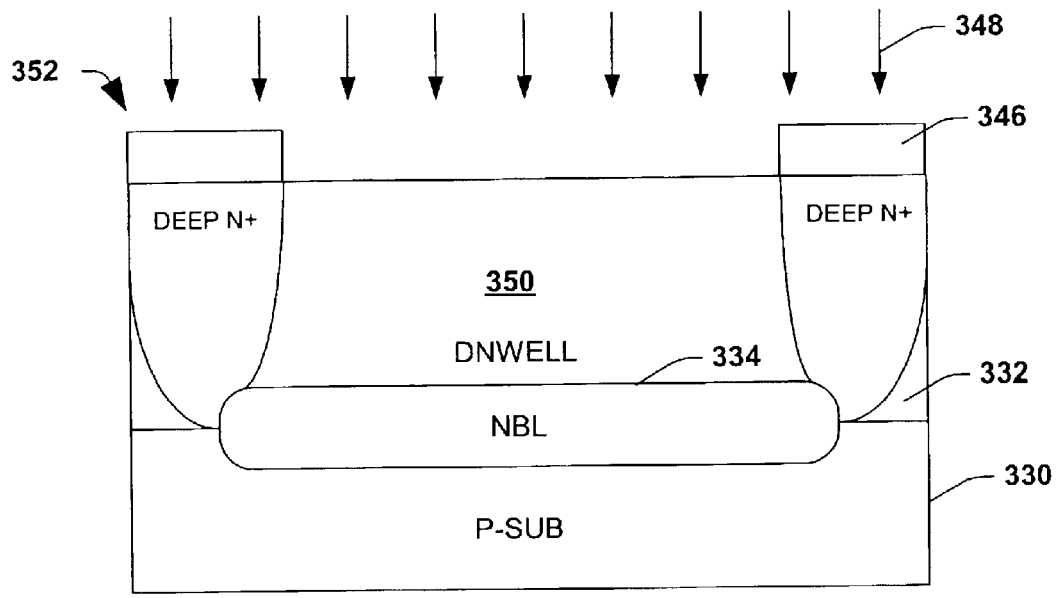
FIG. 19 is a fragmentary cross section diagram illustrating formation of a deep well region in the semiconductor layer down to the NBL, wherein the deep well region, deep implant regions and NBL collectively define a transistor collector region.

Deep N+ regions are formed in the semiconductor layer 332 at 336 of FIG. 16 in order to define one or more collector contact regions. For example, as illustrated in FIG. 18, a mask 338 is formed over the device and an n-type, high energy implantation 340 is performed to form collector contact regions 342 which extend down to and connect with the NBL region 334. A deep n-well region is then formed in the p-type semiconductor material at 344 of FIG. 16. For example, as illustrated in FIG. 19, a deep n-well mask 346 is formed over the device and a lightly doped, high energy implant 348 is performed to form an n-well region 350 between the deep N+ collector contact regions 342. The NBL region 334, deep N+ contact regions 342 and deep n-well region 350 together define the collector region 352 of the bipolar transistor.

Figure 20:
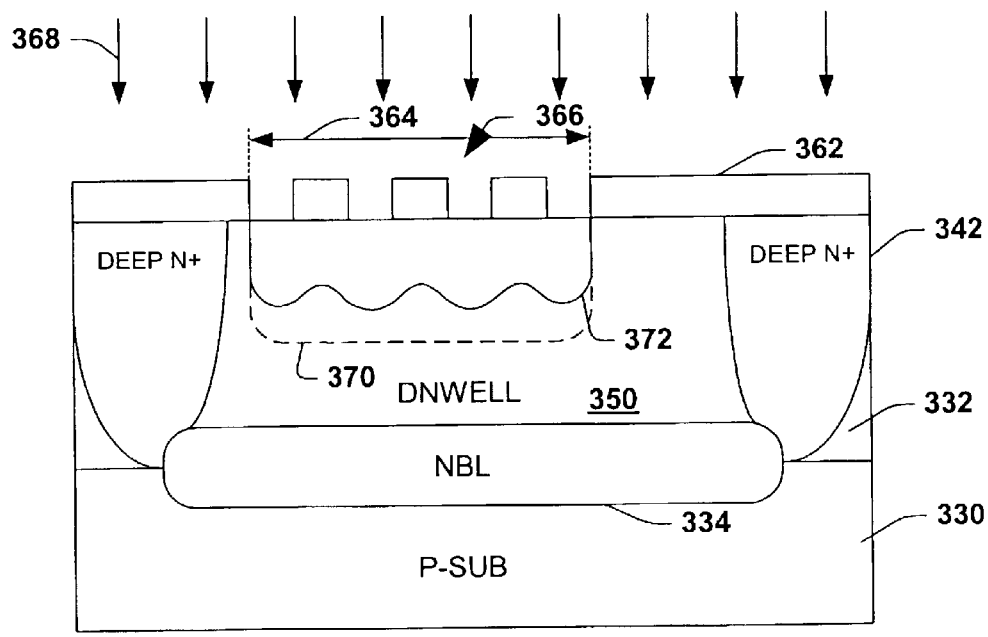
FIG. 20 is a fragmentary cross section diagram illustrating an island/grid type shallow well mask formed over the semiconductor layer in the deep well region, and a conventional base region illustrated therein in phantom.

Returning to FIG. 16, a shallow p-well region is formed in the deep n-well region 350 using an island/grid type implant mask at 360. The shallow p-well implant mask is employed for the formation of a base region within the deep n-well portion 350 of the collector 352, and the openings in the island/grid type mask have dimensions which are less than the implantation design rule associated with the shallow p-well implant. For example, as illustrated in FIG. 20, an implant mask 362 overlies the device and has a macroscopic opening 364 associated with a desired base region. Note, however, that the macroscopic opening 364 comprises a plurality of microscopic openings 366 that are smaller than the implantation design rule.

A shallow p-well implant 368 is performed through the mask 362, followed by thermal processing. Since the openings 366 are smaller than the implantation design rule, less dopant is implanted into the deep n-well region 350, consequently, the resulting base region 372 is more shallow than a traditional base region (a shallow p-well) 370 illustrated in phantom in FIG. 20. Rather, the individual doped regions in the deep n-well region diffusion laterally together to form the base region 372, however, due to less dopant therein, a vertical diffusion associated therewith is decreased. Consequently, as illustrated in FIG. 21, a depth 374 is less than a depth 376 associated with the conventional base region 370 illustrated in phantom.

Referring again to FIG. 16, a base contact and an emitter are formed at 380 and 382, respectively, using source/drain masks and p-type and n-type source/drain implants, respectively. That is, the same implant employed to form the PMOS and NMOS transistor source/drain regions elsewhere on the die is employed to form the base contact and emitter region for the bipolar transistor. For example, as illustrated in FIG. 21, a base contact region 386 (PSD) and an emitter region 388 (NSD) are illustrated within the base region 372.

Figure 21:
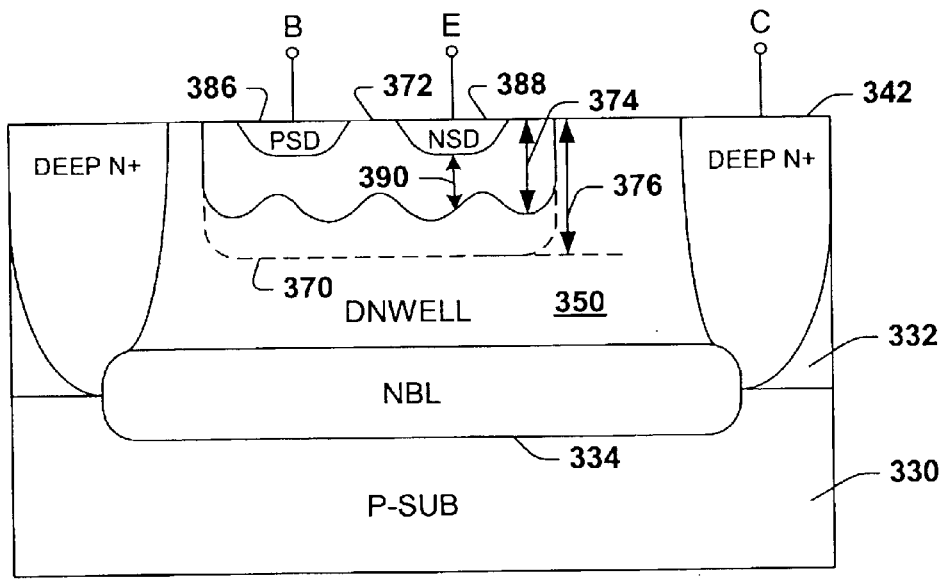
FIG. 21 is a fragmentary cross section diagram illustrating a shallow well base region formed in the deep well collector region using the island/grid type shallow well mask of the present invention, wherein the resultant base region has a depth which is less than a conventional base region illustrated in phantom.

Note that in FIG. 21, the depth 374 of the base region 372 is substantially less than the depth 376 of a traditional base 370 formed via a shallow p-well implant. Since the emitter depth is dictated by the NSD implant, a difference 390 represents an intrinsic region base width that influences substantially the bipolar transistor gain. More particularly, with the shallow base region, the base width 390 is substantially reduced and such reduction causes an increase in the transistor gain, and such performance advantage is obtained without additional process or masking steps.

In FIG. 20, the small openings 366 in the shallow p-well implant mask are formed throughout the entire length of the macroscopic opening 364, and thus as shown in FIG. 21, the reduced depth 374 associated with the base region 372 extends along the entire base, including the extrinsic portion (the portion not under or near the emitter 388), as well as the intrinsic portion under or near the emitter 388.

Figure 22:
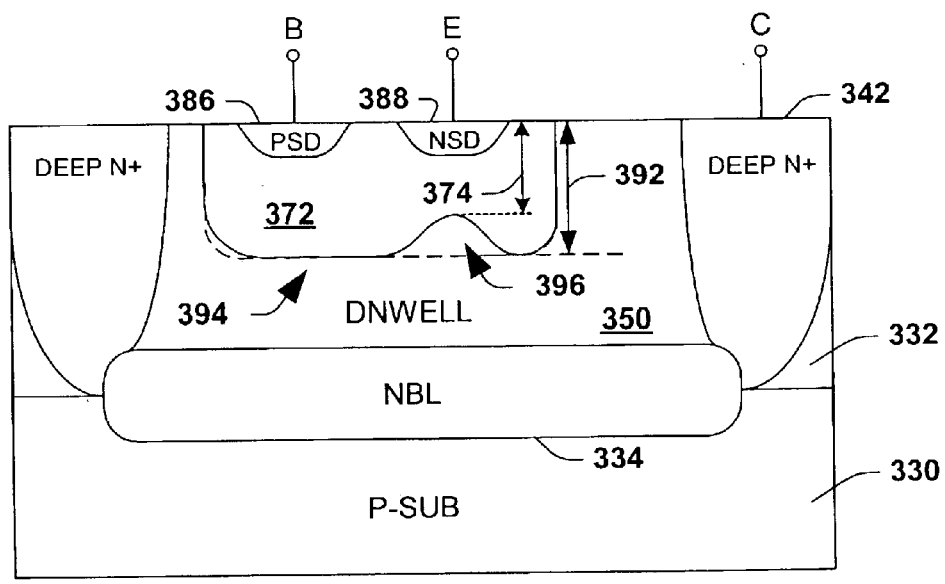
FIG. 22 is a fragmentary cross section diagram illustrating another shallow well base region formed in the deep well collector region using a variation of the island/grid type shallow well mask of the present invention, wherein a depth of an intrinsic region under an emitter is less than a depth of an extrinsic region.

Alternatively, the shallow p-well mask 362 may be patterned differently such that the macroscopic opening 364 has a substantially large opening (larger than the implant design rule) associated with the extrinsic portion of the base region, and one or more smaller openings (smaller than the implant design rule) associated with the intrinsic portion of the base. For example, as illustrated in FIG. 22, the resultant base region 372 has a depth 392 generally coincident with a depth of the conventional shallow p-well region in an extrinsic region 394 of the base, and the reduced depth 374 associated with an intrinsic region 396, as may be desired. This and other alternatives may be employed and are contemplated as falling within the scope of the present invention.

Figure 23:
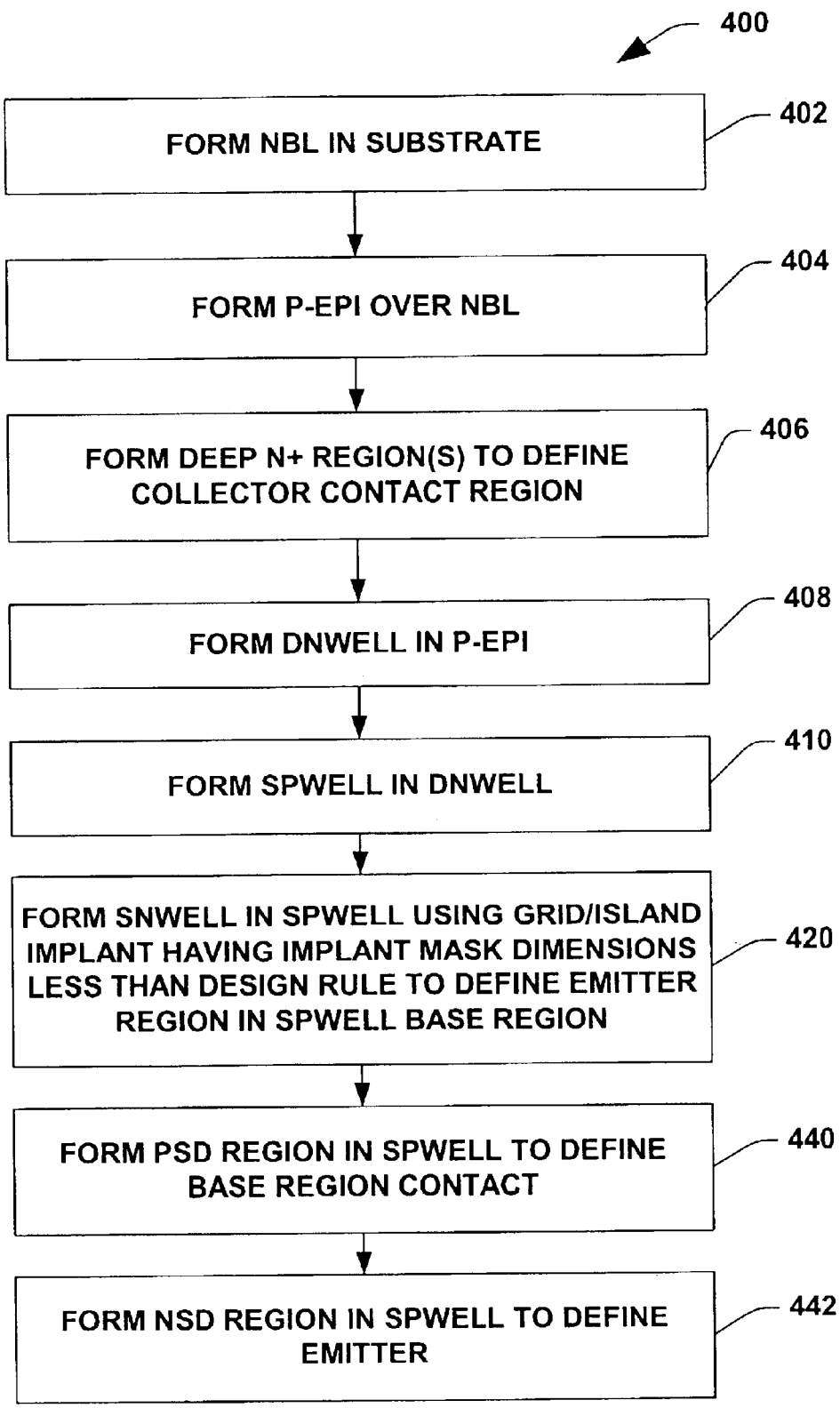
FIG. 23 is a flow chart diagram illustrating a method of forming a bipolar transistor employing an island/grid type shallow well mask and shallow well implant to form an emitter region using the shallow well implant within a base region formed by another shallow well implant, and resulting in a deeper emitter region and higher transistor gain without additional mask or processing steps according to the present invention.

In accordance with still another aspect of the present invention, the principles described supra in conjunction with FIGS. 4–6 may be employed in forming another bipolar type transistor in conjunction with a BiCMOS process, as illustrated in the flow chart of FIG. 23, and designated at reference numeral 400. The method 400 comprises forming an NBL region in a substrate at 402, forming a p-type semiconductor layer thereover at 404, forming deep N+ regions extending down to the NBL at 406, and forming a deep n-well region between the deep N+ regions extending down to the NBL to define a collector region at 408 in a manner similar to that illustrated previously in FIGS. 17–19.

Figure 24:
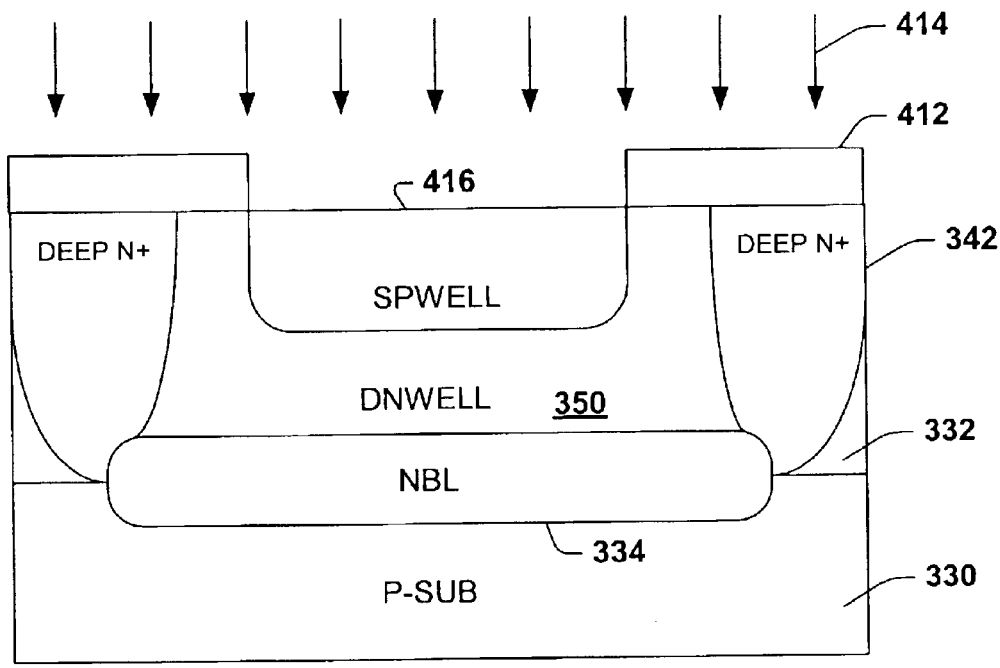
FIG. 24 is a fragmentary cross section diagram illustrating an NBL formed in a substrate having a semiconductor layer formed thereover with a deep well region and deep implant regions formed therein to define a collector, and a shallow well base region formed in the collector region according to the present invention.

A shallow p-well region is then formed in the deep n-well region at 410. For example, as illustrated in FIG. 24, a shallow p-well mask 412 is formed over the device and a shallow p-well implant 414 is performed resulting in a shallow p-well region 416 within the deep n-well region 350, wherein the shallow p-well region 416 corresponds to the base of the bipolar transistor.

Figure 25:
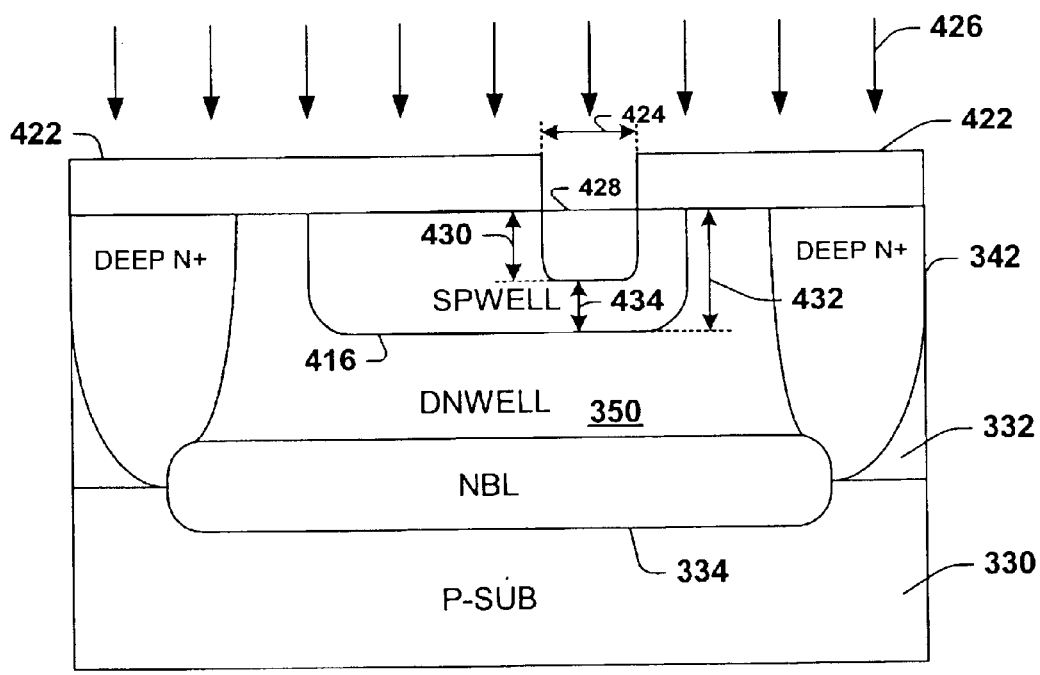
FIG. 25 is a fragmentary cross section diagram illustrating an island/grid type emitter mask having an opening associated therewith smaller than an implantation design rule, and a emitter region formed in the shallow well base region using a shallow well implant, wherein the emitter region is more shallow than the base region.

The method 400 of FIG. 23 continues at 420, wherein a grid/island type shallow n-well mask is formed over the device and a shallow n-Well implant is performed using the mask to form a shallow n-well region in the base to define an emitter region therein. For example, as illustrated in FIG. 25, a shallow n-well mask 422 overlies the substrate and has an opening 424 therein over the base region 416, wherein the opening (or openings) size 424 is smaller than the implantation design rule for a shallow n-well implant 426.

The implant 426 is performed through the mask 422 to form a shallow n-well region 428 in the base 416. Normally, a shallow n-well region will have a depth approximately equal to a depth of the shallow p-well region which defines the base 416, however, in the present invention, since the mask opening size 424 is smaller than the implantation design rule, an amount of dopant therein is less than would otherwise occur. This phenomenon results in less diffusion of the resultant region 428, and thus a depth 430 of the emitter is less than a depth 432 of the base 416.

Note that in conventional bipolar transistor devices fabricated in a BiCMOS process, the emitter is often formed using a source/drain implant and thus has a depth dictated by the energy of the source/drain implant and the thermal cycle of source/drain. For CMOS optimization purposes, such source/drain junctions are made shallow by limiting the thermal cycle time. The shallow junctions thus result in a shallow emitter region in conventional devices, thereby making the base width substantially large which negatively impacts the transistor gain.

In the present invention, use of an island/grid type shallow n-well mask allows for a shallow n-well region that is shallower than a typical shallow n-well region, thereby allowing use of such region as a transistor emitter. Therefore the emitter 428 of FIG. 25 is substantially deeper than a conventional transistor device, and the base width 434 associated therewith is decreased substantially, advantageously increasing the transistor gain. Further, such advantages are obtained without requiring additional processing or masking steps.

Figure 26:
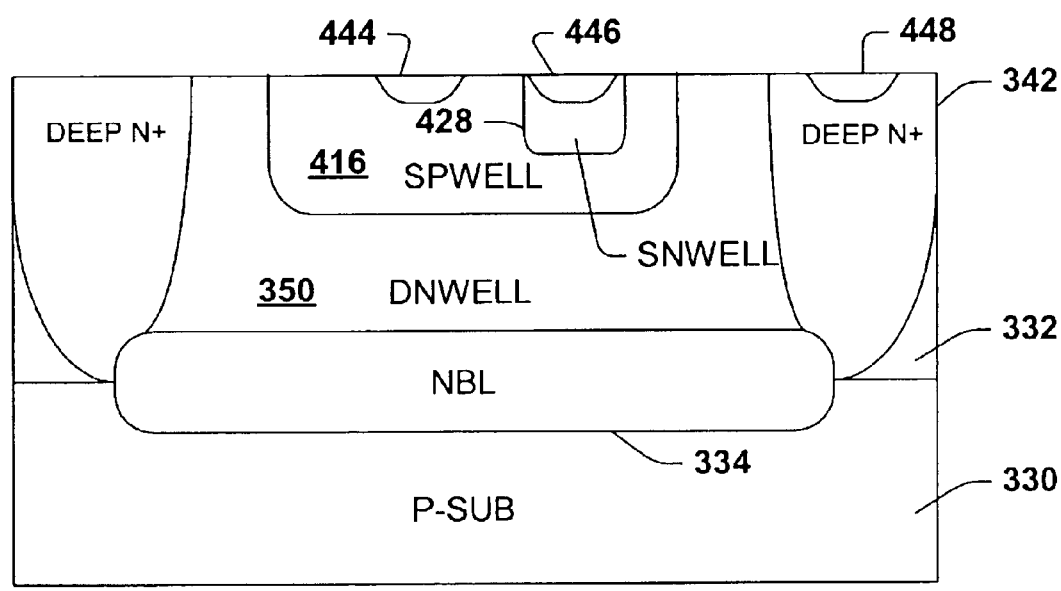
FIG. 26 is a fragmentary cross section diagram illustrating CMOS type source/drain implants formed in a top portion of the device to form transistor contact regions and illustrating a depth difference in the emitter region leading to an improved transistor gain without additional processing or masking steps according to the present invention.

Returning to FIG. 23, the method 400 concludes at 440 and 442 with PMOS and NMOS source/drain implants, which form a base region contact and an emitter region contact, respectively. For example, as illustrated in FIG. 26, the PMOS source/drain implant (employed with an appropriate mask, not shown) results in a base contact 444 in the base region 416. Similarly, the NMOS source/drain implant (employed with an appropriate mask, not shown) results in an emitter contact 446 (and a collector contact 448, if desired), as illustrated.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A method of concurrently forming two doped regions in a semiconductor substrate, comprising:
    forming a mask layer over a semiconductor substrate having a first conductivity type;
    patterning the mask layer to form two openings therein, wherein a first opening is larger than a second opening, and wherein the first opening is larger than a second opening, and wherein the first opening is larger than an implantation design rule, and the second opening is less than the implantation design rule; and
    selectively implanting the semiconductor substrate with ions of a second conductivity type through the openings in the patterned mask layer, thereby defining a first implanted region associated with the first opening and having a first depth associated therewith and a second implanted region associated with the second opening and having a second depth associated therewith, and wherein the first depth is greater than the second depth.

2. The method of claim 1, wherein the mask layer comprises a photoresist.

3. The method of claim 1, wherein the first conductivity type comprises p-type and the second conductivity type comprises n-type.

4. The method of claim 1, wherein the total dopant in the first region is higher than the total dopant in the second region due to the first opening being larger than the design rule and the second opening being smaller than the design rule, and further comprising annealing the substrate, wherein the first region diffuses a distance which is greater than a diffusion distance of the second region, resulting in the first depth being greater than the second depth.

5. A method of forming a bipolar transistor in a BiCMOS process, comprising:
    forming a patterned buried layer mask over a semiconductor substrate, the substrate having a first conductivity type, wherein the patterned buried layer mask comprises a plurality of openings therein, and wherein each of the plurality of openings are smaller than a distance required by an implantation design rule;
    performing a buried layer implant into the substrate with ions of a second conductivity type through the openings in the patterned buried layer mask, resulting in a plurality of distinct implanted regions in the substrate corresponding to the openings;
    thermally processing the substrate after the buried layer implant, wherein the implanted regions laterally diffuse together to form a buried layer of the second conductivity type in the substrate;
    forming a semiconductor layer of the first conductivity type over the buried layer and the substrate, the semiconductor layer forming a base region;
    selectively implanting a deep collector region of the second conductivity type into the semiconductor layer, the deep collector region extending down and coupling to a portion of the buried layer, wherein the deep collector region and the buried layer together form a collector of the bipolar transistor;
    selectively performing a source/drain implant of the second conductivity type into the semiconductor layer, the source/drain implant forming an emitter region within the base region, and wherein a distance between a bottom portion of the emitter and a top portion of the buried layer influences a collector-to-emitter breakdown voltage of the bipolar transistor.

6. The method of claim 5, wherein the first conductivity type is p-type and the second conductivity type is n-type, thereby defining an NPN type bipolar transistor.

7. The method of claim 5, wherein the patterned buried layer mask comprises a photoresist.

8. The method of claim 5, wherein selectively implanting the deep collector region further comprises implanting a ring of the deep collector into the semiconductor layer and down to the buried layer, the p-type region surrounded by the deep collector ring defining an area of the base region.

9. The method of claim 5, wherein forming the patterned buried layer mask further comprises forming another opening therein, wherein the another opening is larger than the distance required by the implantation design rule.

10. The method of claim 9, wherein the buried layer implant implants ions of the second conductivity type into the semiconductor layer through the another opening, and the annealing of the substrate causes the ions to diffuse a distance into the substrate that is greater than a diffusion distance associated with the buried layer.

11. The method of claim 10, wherein processing performed subsequent to the buried layer implant causes the ions in the semiconductor layer associated with the buried layer and the another opening to diffuse up into the semiconductor layer, and wherein a diffusion distance associated with the ions of the another openings is greater than a diffusion distance of the buried layer.

12. The method of claim 5, wherein forming the semiconductor layer comprises depositing the semiconductor layer over the semiconductor substrate and the buried layer via an epitaxial growth process, wherein the semiconductor layer is an epi layer of the first conductivity type.

13. A method of forming a bipolar transistor in a BICMOS process, comprising:
    forming a buried layer of a second conductivity type in a semiconductor substrate of a first conductivity type;

forming an epi layer of the first conductivity type over the buried layer and the semiconductor substrate with epitaxial growth process;

forming a deep collector region of the second conductivity type in the epi layer, the deep collector region extending down and coupling to a portion of the buried layer;

forming a deep well region of the second conductivity type in the epi layer, the deep well region extending down to the buried layer and extending laterally to the deep collector region wherein the deep well region, the deep collector region and the buried layer together form a collector of the bipolar transistor;

forming a shallow well mask on the epi layer, the shallow well mask having a plurality of openings overlying the deep well region in the epi layer, wherein at least one of the openings is smaller than distance required by an implantation design rule;

selectively implanting ions of a first conductivity type into the deep well region through the plurality of openings in the shallow well mask, resulting in a plurality of distinct implanted regions in the deep well region corresponding to the openings;

thermally processing the substrate, wherein the implanted regions laterally diffuse together to form a shallow well region of the first conductivity type within the deep well region of the second conductivity type, the shallow well region forming a base region within the collector region; and selectively performing a source/drain implant of the second conductivity type into the shallow well region, the source/drain implant forming an emitter region within the base region of the bipolar transistor.

14. The method of claim 13, wherein forming the buried layer comprises selectively implanting ions of the second conductivity type into the substrate through a patterned mask.

15. The method of claim 13, wherein the shallow well mask has at least two openings associated therewith, wherein a first opening is associated with an extrinsic portion of the base region and has a size which is greater than the distance required by the implantation design rule, and wherein a second opening is associated with an intrinsic portion of the base region and has a size which is less than the distance required by the implantation design rule.

16. The method of claim 15, wherein selectively implanting ions into the deep well region through the shallow well mask comprises concurrently exposing both the first and second openings to an implantation dose, wherein a resultant concentration of ions in a first region of the deep well region corresponding to the first opening is greater than a concentration of ions in a second region of the deep well region corresponding to the second opening.

17. The method of claim 16, wherein thermally processing the substrate causes ions in the first region and the second region to laterally diffuse together resulting in the shallow well region, and wherein the ions in the first region diffuse vertically a greater distance than a vertical diffusion of ions in the second region, resulting in the shallow well region having a depth in the extrinsic region of the base which is greater than a depth in the intrinsic region of the base.

18. The method of claim 17, wherein the source/drain implant forming the emitter is performed in the intrinsic region of the base, and wherein a distance between a bottom portion of the emitter and a bottom portion of the intrinsic region of the base influence a gain of the bipolar transistor.

19. The method of claim 13, wherein the first conductivity type is p-type and the second conductivity type is n-type, resulting in an NPN bipolar transistor.

20. A method of forming a bipolar transistor in a BiCMOS process, comprising:

forming a buried layer of a second conductivity type in a semiconductor substrate of a first conductivity type;

forming an epi layer of the first conductivity type over the buried layer and the semiconductor substrate with an epitaxial growth process;

forming a deep collector region of the second conductivity type in the epi layer, the deep collector region extending down and coupling to a portion of the buried layer;

forming a deep well region of the second conductivity type in the epi layer, the deep well region extending down to the buried layer and extending laterally to the deep collector region, wherein the deep well region, the deep collector region and the buried layer together form a collector of the bipolar transistor;

forming a shallow well region of the first conductivity type within the deep well region, the shallow well region forming a base region of the bipolar transistor;

forming an emitter mask over the substrate, the emitter mask having a first opening located over the shallow well region which is smaller than a distance required by a shallow well implantation design rule, and the emitter mask having a second opening located elsewhere which is larger than the shallow well implantation design rule;

selectively implanting ions of the second conductivity type into the shallow well region and into another region of the second conductivity type through the openings in the emitter mask, resulting in two distinct implanted regions, wherein a first region resides in the shallow well region and a second region resides elsewhere in the substrate;

thermally processing the substrate, wherein the implanted regions undergo diffusion to form an emitter region of the second conductivity type within the shallow well region of the first conductivity type and a shallow well region of the second conductivity type elsewhere, wherein a depth of the emitter region is less than a depth of the shallow well regions of the first and second conductivity types, respectively.

21. The method of claim 20, further comprising selectively performing a source/drain implant of the second conductivity type into the emitter region, the source/drain implant forming an emitter contact region within the emitter region of the bipolar transistor.

22. The method of claim 21, further comprising selectively performing a source/drain implant of the first conductivity type into the shallow well region of the first conductivity type, thereby forming a base contact region within the base region of the bipolar transistor.

23. The method of claim 20, wherein the first conductivity type comprises p-type and the second conductivity type comprises n-type, wherein the transistor comprises an NPN bipolar transistor having an emitter region formed by a shallow N-well implant within a shallow P-well base region, and wherein a depth of the emitter region is less than a depth of the base region, and wherein a difference in the depths influences a gain of the bipolar transistor.

* * * * *